(12) United States Patent
Khan et al.

(10) Patent No.: US 9,740,809 B2
(45) Date of Patent: Aug. 22, 2017

(54) EFFICIENT INTEGRATED CIRCUITS CONFIGURATION DATA MANAGEMENT

(71) Applicant: Altera Corporation, San Jose, CA (US)

(72) Inventors: Junaid Asim Khan, Mississauga (CA); Scott James Brissenden, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/837,928

(22) Filed: Aug. 27, 2015

(65) Prior Publication Data

US 2017/0061055 A1  Mar. 2, 2017

(51) Int. Cl.
*G06F 17/50* (2006.01)
(52) U.S. Cl.
CPC ................ *G06F 17/5054* (2013.01)
(58) Field of Classification Search
CPC .................... G06F 17/5054; G06F 17/5063
USPC .................................................. 716/116, 117
See application file for complete search history.

(56) References Cited

U.S. PATENT DOCUMENTS

| | | | |
|---|---|---|---|
| 5,745,734 A | 4/1998 | Craft et al. | |
| 7,024,654 B2 * | 4/2006 | Bersch et al. | G06F 17/5063 716/117 |
| 7,359,956 B2 * | 4/2008 | Kanai et al. | H04L 29/06 341/51 |
| 7,385,532 B1 | 6/2008 | Schumacher | |
| 7,589,648 B1 | 9/2009 | Ma et al. | |
| 7,808,405 B1 | 10/2010 | Chen | |
| 7,902,865 B1 | 3/2011 | Cheng et al. | |
| 8,674,856 B2 | 3/2014 | Agarwal et al. | |
| 8,705,635 B2 * | 4/2014 | Lee et al. | G06T 9/00 375/240.23 |
| 9,232,221 B2 * | 1/2016 | Lee et al. | G06T 9/00 |
| 2003/0090397 A1 | 5/2003 | Rasmussen | |
| 2010/0180016 A1 * | 7/2010 | Bugwadia et al. | G06F 9/4411 709/220 |

OTHER PUBLICATIONS

Khan et al, U.S. Appl. No. 14/200,897, filed Mar. 7, 2014.
(Continued)

*Primary Examiner* — Sun Lin
(74) *Attorney, Agent, or Firm* — Jason Tsai

(57) ABSTRACT

Circuitry for efficient configuration data management is presented. The circuitry includes an encoding circuit that compares configuration data of a circuit design with base configuration data of a base circuit design. The encoding circuit compresses the difference between the configuration data and the base configuration data to produce compressed configuration data. The compressed configuration data can be stored in a storage circuit. For a purpose of implementing the circuit design in an integrated circuit, a decoding circuit can retrieve the compressed configuration data from the storage circuit, decompress the compressed configuration data, and compare the result of a decompression operation with the base configuration data to restore the configuration data. The restored configuration data can serve to program configuration memory bits on the integrated circuit, thereby implementing the circuit design.

25 Claims, 8 Drawing Sheets

(56) References Cited

OTHER PUBLICATIONS

Huang et al.: "A Self-Reconfigurable Platform for Scalable DCT Computation Using Compressed Partial Bitstreams and BlockRAM Prefetching", IEEE Transactions on Circuits and Systems for Video Technology, IEEE Service Center, Piscataway, NJ, USA, vol. 19, No. 11, Nov. 1, 2009 (Nov. 1, 2009), pp. 1623-1632, XP011275990, ISSN: 1051-8215, DOI: 10.1109/TCSVT.2009.2031464.
Bayar et al. "Self-reconfiguration on Spartan-III FPGAs with compressed partial access port (cPCAP) core", Research in Microelectronics and Electronics, 2008, Prime 2008, Ph.D, IEEE, Piscataway, NJ, USA, Jun. 22, 2008 (Jun. 22, 2008), pp. 137-140, XP031303556, ISBN: 978-1-4244-1983-8.
Jones et al., "Dynamic Reconfiguration and Incremental Firmware Development in the Xilinx Virtes 5", Jan. 1, 2008 (Jan. 1, 2008), XP055334965, DOI: 10.5170/CERN-2008-008.583. Retrieved from the Internet: <URL:https://cds.cern.ch/record/1160904/files/p583.pdf>.
Amano et al.; "Technique for Virtual Hardware on a Dynamically Reconfigurable Processor—An approach for Tough cases", Security in Communication Networks: Third International Cinference; Revised Papers/SCN 2002, Amalfi, Italy, Sep. 11-13, 2002; [Lecture Notes in Computer Science, ISSN 0302-9743], Springer Verlad, DE, vol. 3203, Aug. 30, 2004 (Aug. 30, 2004), pp. 464-473, X8002348273, ISBN: 978-3-540-24128-7.
Hauck et al.; "Runlength compression techniques for EPGA configurations", Field-Programmable Custom Cpmputing Machines, 1999, FCCM '99. Proceedings. Seventh Annual ISSS Symposium on Napa Valley, CA, USA, Apr. 21-23, 1999, Lose Alamitos, CA, USA, ISSS Comput. Soc, US, Apr. 21, 1999 (Apr. 21, 1999), pp. 286-287, XP010359187, DOI: 10.1109/FPGA.1999.803700, ISBN: 978-0-7695-0375-2.

* cited by examiner

EFFICIENT INTEGRATED CIRCUITS CONFIGURATION DATA MANAGEMENT

BACKGROUND

This relates to integrated circuits and, more particularly, to efficiently managing configuration data that determine the implementation of circuit designs in an integrated circuit.

Every transition from one technology node to the next technology node has resulted in smaller transistor geometries and thus potentially more functionality implemented per unit of integrated circuit area.

Integrated circuits often include configuration memory bits that enable the customization of functional blocks by programming the configuration memory bits with configuration data. An increase in size of the integrated circuit often leads to an increase in the size of the functional blocks and thus to an increase in the amount of configuration data. Since the configuration data is often stored in a storage circuit, bigger storage circuits are required to store the increased amount of configuration data.

The problem of having increased amounts of configuration data is aggravated by partial reconfiguration that has recently emerged as a way of implementing multiple different circuit designs in the same partition of an integrated circuit at different times. Consider the example in which an integrated circuit partition includes configuration memory bits. A first configuration data set programs these configuration memory bits to implement a first circuit design; and the first circuit design implementation is operating on the integrated circuit partition during a first duration of time.

After the first duration of time, the configuration memory bits on the integrated circuit partition are reprogrammed using a second configuration data set. Thus, the first circuit design implementation is replaced by a second circuit implementation, and the second circuit design implementation operates on the integrated circuit partition during a second duration of time. In practice, more than two circuit design implementations are often sharing the same integrated circuit partition through partial reconfiguration.

In this example, the amount of configuration data that needs to be stored in the storage circuit significantly increases with each additional circuit design implementation; and the increased memory size requirements can have a significant impact on the cost of operating the integrated circuit.

SUMMARY

Configuration circuitry for efficiently managing configuration data is presented. The configuration circuitry may include a decoding circuit, which may include first and second circuits. The decoding circuit may receive a base configuration data set and a first data set. The first circuit may receive the first data set, which may include compressed data differences between the base configuration data set and a decoded configuration data set. If desired, the first circuit may decompress the received first data set to create a second data set. The second circuit may receive the base configuration data set and the second data set from the first circuit and restore a decoded configuration data set using the base configuration data set and the second data set.

It is appreciated that the present invention can be implemented in numerous ways, such as a process, an apparatus, a system, a device, or instructions on a computer readable medium. Several inventive embodiments are described below.

In certain embodiments, the above mentioned configuration circuitry may program a configurable circuit using the decoded configuration data set to implement a first circuit design on the configurable circuit. If desired, the first circuit may receive a third data set that includes other compressed data differences between the base configuration data set and an additional decoded configuration data set. The first circuit may decompress the received third data set to create a fourth data set.

In some embodiments, the second circuit may receive the base configuration data set and the fourth data set from the first circuit. If desired, the second circuit may restore the additional decoded configuration data set using the base configuration data set and the fourth data set.

Further features of the invention, its nature and various advantages, will be more apparent from the accompanying drawings and the following detailed description of the preferred embodiments.

DETAILED DESCRIPTION

The present embodiments relate to integrated circuits and, more particularly, to efficiently managing configuration data that determine the implementation of circuit designs in an integrated circuit.

As mentioned above, in the Background section, bigger storage circuits may be required to store the increased amount of configuration data that is used to program configuration memory bits in an integrated circuit. The increased amount of configuration data may stem from an increase in transistor density (i.e., the number of transistors per unit of area) in integrated circuits and/or the use of partial reconfiguration that has recently emerged as a way of implementing multiple different circuit designs in the same partition of an integrated circuit at different times.

The increased amount of configuration data that requires the use of bigger storage circuits may have a significant impact on the cost of operating the integrated circuit. Therefore, it may be desirable to more efficiently manage the configuration data that is used to program configuration memory bits without affecting the functionality of the integrated circuit.

It will be obvious to one skilled in the art, that the present exemplary embodiments may be practiced without some or all of these specific details. In other instances, well-known operations have not been described in detail in order not to unnecessarily obscure the present embodiments.

Embodiments relate to methods for using computer-aided design (CAD) tools, which are sometimes also referred to as design automation (DA) tools or electronic design automation (EDA) tools, for optimizing circuit designs represented by configuration memory bits for implementation in integrated circuits. The integrated circuit may be any suitable type of integrated circuit, such as microprocessors, application-specific integrated circuits, digital signal processors, memory circuits, etc. If desired, the integrated circuits may be programmable. In other words, at least a portion of such an integrated circuit may be configured by a user to perform the functionality described in the circuit design using programmable circuitry. The programmable circuitry can be configured by adjusting the settings of configuration memory elements.

Figure 1:
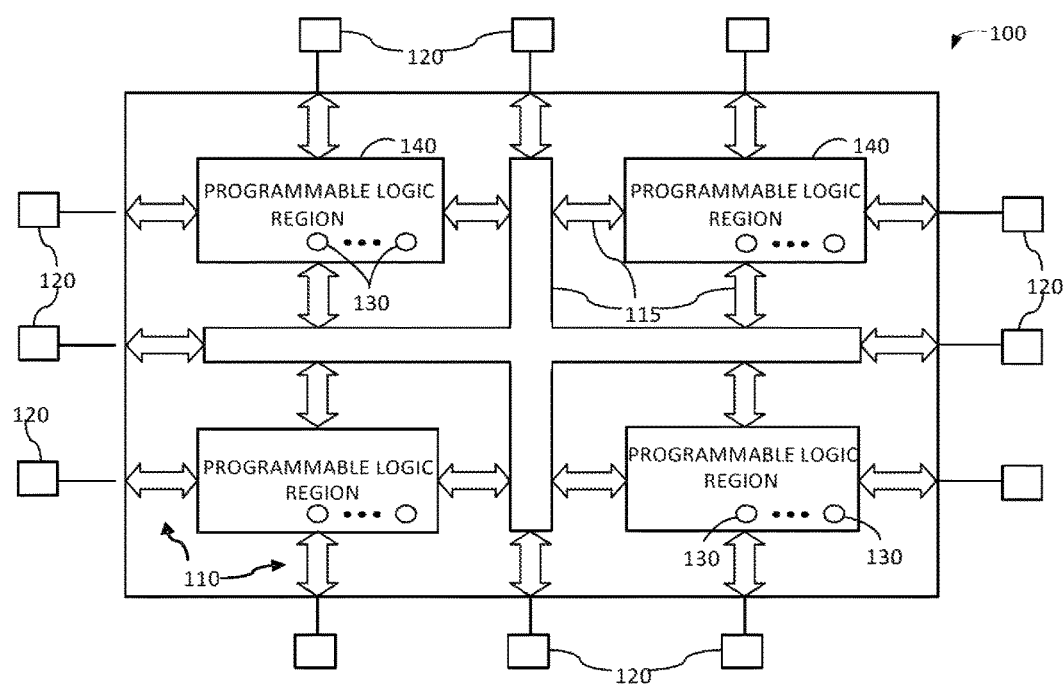
FIG. 1 is a diagram of an illustrative programmable integrated circuit with programmable logic regions in accordance with an embodiment.

An illustrative embodiment of an integrated circuit such as a programmable logic device 100 in accordance with the present invention is shown in FIG. 1.

Programmable logic device 100 has input/output circuitry 110 for driving signals off of device 100 and for receiving signals from other devices via input/output pins 120. Interconnection resources 115 such as global and local vertical and horizontal conductive lines and buses may be used to route signals on device 100.

Input/output circuitry 110 include conventional input/output circuitry, serial data transceiver circuitry, differential receiver and transmitter circuitry, or other circuitry used to connect one integrated circuit to another integrated circuit.

Interconnection resources 115 include conductive lines and programmable connections between respective conductive lines and are therefore sometimes referred to as programmable interconnects 115.

Programmable logic region 140 may include programmable components such as digital signal processing circuitry, storage circuitry, arithmetic circuitry, or other combinational and sequential logic circuitry. The programmable logic region 140 may be configured to perform a custom logic function. The programmable logic region 140 may also include specialized blocks that perform a given application and have limited configurability. For example, the programmable logic region 140 may include specialized blocks such as configurable storage blocks, configurable processing blocks, programmable phase-locked loop circuitry, programmable delay-locked loop circuitry, or other specialized blocks with limited configurability. The programmable interconnects 115 may also be considered to be a type of programmable logic region 140.

Programmable logic device 100 contains programmable memory elements 130. Memory elements 130 can be loaded with configuration data (also called programming data) using pins 120 and input/output circuitry 110. Once loaded, the memory elements each provide a corresponding static control signal that controls the operation of an associated logic component in programmable logic region 140. In a typical scenario, the outputs of the loaded memory elements 130 are applied to the gates of metal-oxide-semiconductor transistors in programmable logic region 140 to turn certain transistors on or off and thereby configure the logic in programmable logic region 140 and routing paths. Programmable logic circuit elements that may be controlled in this way include parts of multiplexers (e.g., multiplexers used for forming routing paths in programmable interconnects 115), look-up tables, logic arrays, AND, OR, NAND, and NOR logic gates, pass gates, etc.

Memory elements 130 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 130 are loaded with configuration data during programming, memory elements 130 are sometimes referred to as configuration memory, configuration memory elements, configuration memory bits, configuration RAM, or programmable memory elements.

The circuitry of device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing one or more look-up tables, one or more registers, and programmable multiplexer circuitry. The smaller regions may also be, for example, regions of logic that are sometimes referred to as configurable logic blocks or adaptive logic modules. Each adaptive logic module (ALM) may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) containing multiple logic elements or multiple ALMs.

During device programming, configuration data is loaded into device 100 that configures the programmable logic regions 140 so that their logic resources perform desired logic functions. Circuit design systems may generate configuration data based on a user description of an integrated circuit design.

Figure 2A:
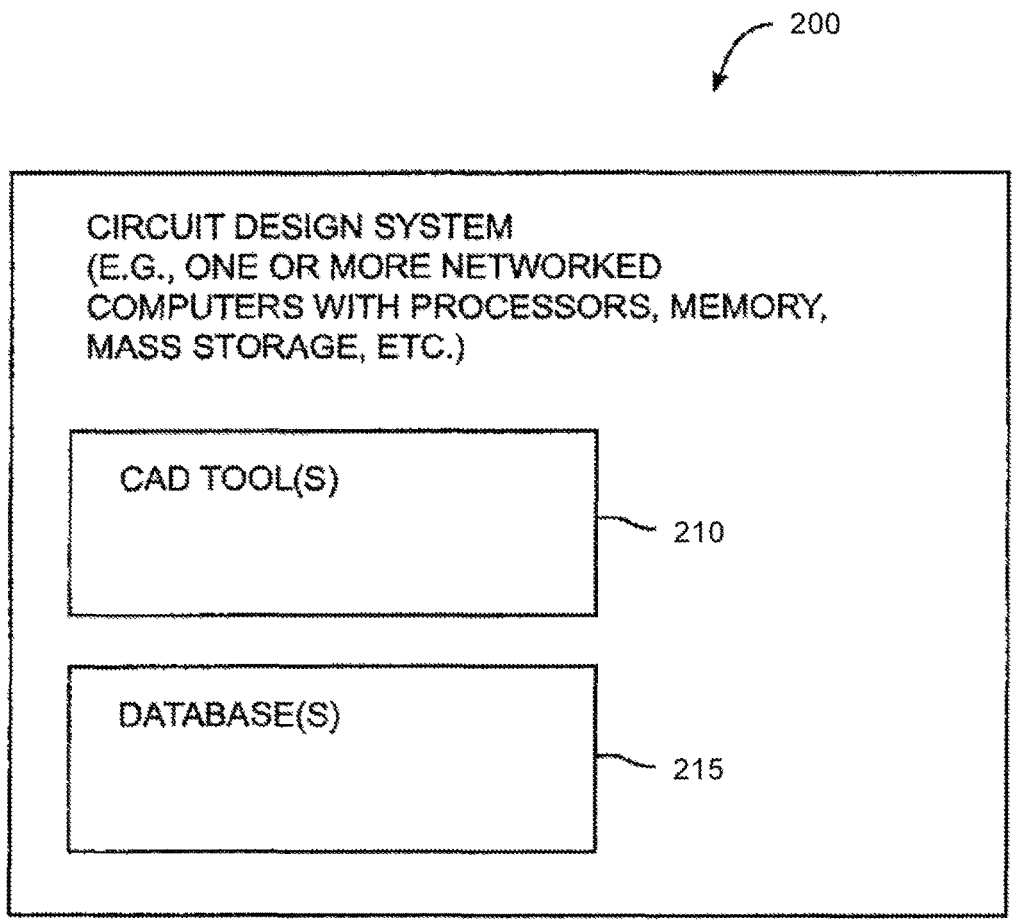
FIG. 2A is a diagram of a circuit design system that may be used to design integrated circuits in accordance with an embodiment.

An illustrative circuit design system 200 in accordance with an embodiment is shown in FIG. 2A. System 200 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 210 and databases 215 reside on system 200. During operation, executable software such as the software of computer aided design tools 210 runs on the processor(s) of system 200. Databases 215 are used to store data for the operation of system 200. In general, software and data may be stored on any computer-readable medium (storage) in system 200. Such storage may include computer memory chips, removable and fixed media such as hard disk drives, flash memory, compact discs (CDs), digital versatile discs (DVDs), blu-ray discs (BDs), other optical media, and floppy diskettes, tapes, or any other suitable memory or storage device(s). When the software of system 200 is installed, the storage of system 200 has instructions and data that cause the computing equipment in system 200 to execute various methods (processes). When performing these processes, the computing equipment is configured to implement the functions of the circuit design system.

The computer aided design (CAD) tools 210, some or all of which are sometimes referred to collectively as a CAD tool or an electronic design automation (EDA) tool, may be provided by a single vendor or by multiple vendors. Tools 210 may be provided as one or more suites of tools (e.g., a compiler suite for performing tasks associated with implementing a circuit design in a programmable logic device) and/or as one or more separate software components (tools). Database(s) 215 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

Tool 210 may receive any circuit design description. For example, a first circuit design description may be converted into a second integrated circuit design description which can be used to implement an integrated circuit (e.g., a mask set for fabrication of an application specific integrated circuit or a configuration bitstream for a programmable logic device).

Figure 2B:
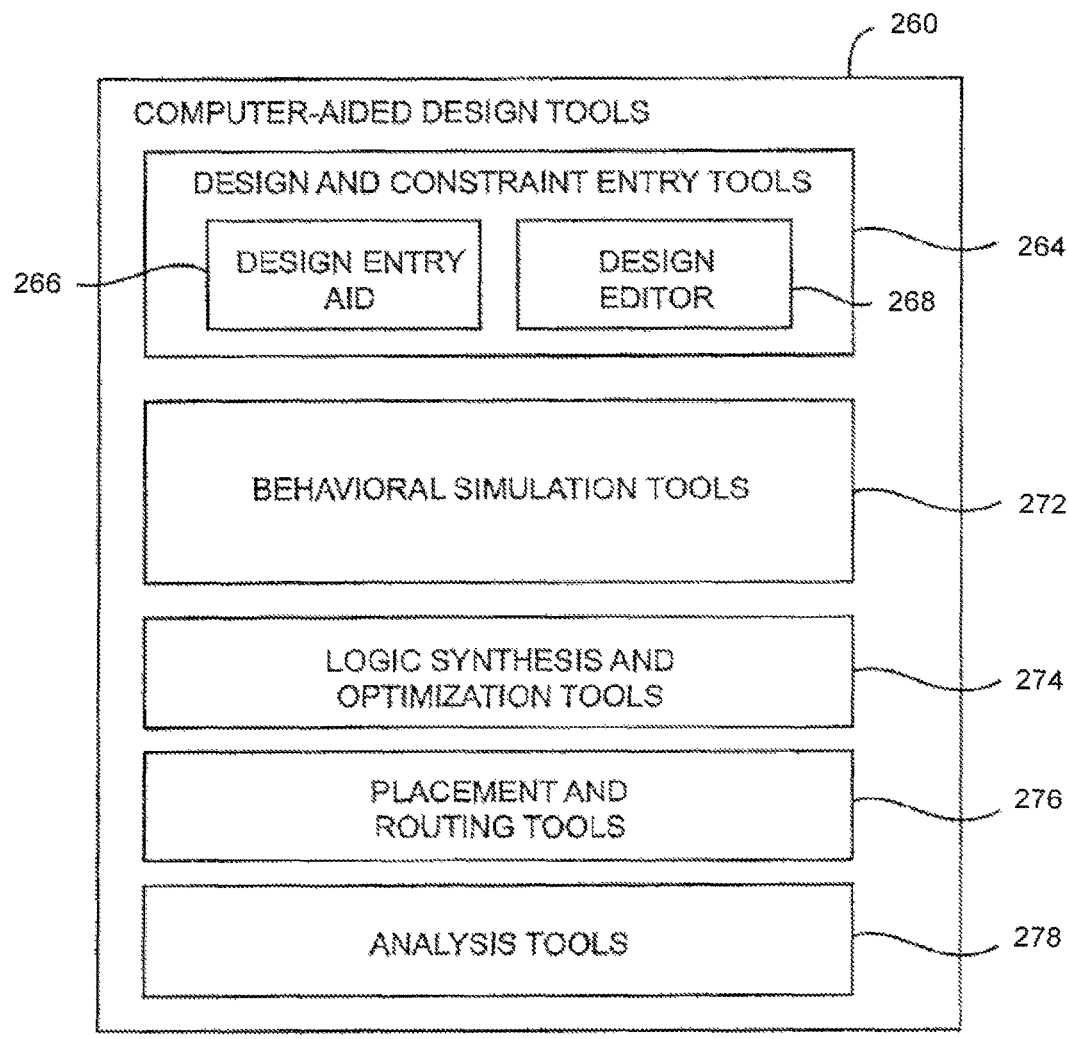
FIG. 2B is a diagram of illustrative computer-aided design (CAD) tools that may be used in a circuit design system in accordance with an embodiment.

Illustrative computer aided design tools 260 that may be used in a circuit design system such as circuit design system 200 of FIG. 2A are shown in FIG. 2B.

The design process may start with the formulation of functional specifications of the integrated circuit design (e.g., a functional or behavioral description of the integrated circuit design). A circuit designer may specify the functional operation of a desired circuit design using design and constraint entry tools 264. Design and constraint entry tools 264 may include tools such as design entry aid 266 and design editor 268. Design entry aid 266 may be used to help a circuit designer locate a desired portion of the design (e.g., an intellectual property (IP) component) from a library of existing circuit designs and may provide computer-aided assistance to the circuit designer for entering (specifying) the desired circuit design.

As an example, design entry aid 266 may be used to present screens of options for a user. The user may click on on-screen options to select whether the circuit being designed should have certain features. Design editor 268 may be used to enter a design (e.g., by entering lines of hardware description language code), may be used to edit, a design obtained from a library (e.g., using a design and constraint entry aid), or may assist a user in selecting and editing appropriate prepackaged code/designs.

Design and constraint entry tools 264 may allow a circuit designer to provide a desired circuit design using any suitable format. For example, design and constraint entry tools 264 may include tools that allow the circuit designer to enter a circuit design using truth tables. Truth tables may be specified using text files or timing diagrams and may be imported from a library. Truth table circuit design and constraint entry may be used for a portion of a large circuit or for an entire circuit.

As another example, design and constraint entry tools 264 may include a schematic capture tool. A schematic capture tool may allow the circuit designer to visually construct integrated circuit designs from constituent parts such as logic gates and groups of logic gates. Libraries of preexisting integrated circuit designs may be used to allow a desired portion of a design to be imported with the schematic capture tools.

If desired, design and constraint entry tools 264 may allow the circuit designer to provide a circuit design to the circuit design system 200 using a hardware description language such as Verilog hardware description language (Verilog HDL) or Very High Speed Integrated Circuit Hardware Description Language (VHDL). The designer of the integrated circuit design can enter the circuit design by writing hardware description language code with editor 268. Blocks of code may be imported from user-maintained or commercial libraries if desired.

After the design has been entered using design and constraint entry tools 264, behavioral simulation tools 272 may be used to simulate the functional performance of the circuit design. If the functional performance of the design is incomplete or incorrect, the circuit designer can make changes to the circuit design using design and constraint entry tools 264. The functional operation of the new circuit design may be verified using behavioral simulation tools 272 before synthesis operations have been performed using tools 274. Simulation tools such as behavioral simulation tools 272 may also be used at other stages in the design flow if desired (e.g., after logic synthesis). The output of the behavioral simulation tools 272 may be provided to the circuit designer in any suitable format (e.g., truth tables, timing diagrams, etc.).

Once the functional operation of the circuit design has been determined to be satisfactory, logic synthesis and optimization tools 274 may generate a gate-level netlist of the circuit design, for example using gates from a particular library pertaining to a targeted process supported by a foundry, which has been selected to produce the integrated circuit. Alternatively, logic synthesis and optimization tools 274 may generate a gate-level netlist of the circuit design using gates of a targeted programmable logic device (i.e., in the logic and interconnect resources of a particular programmable logic device product or product family).

Logic synthesis and optimization tools 274 may optimize the design by making appropriate selections of hardware to implement different logic functions in the circuit design based on the circuit design data and constraint data entered by the logic designer using tools 264.

After logic synthesis and optimization using tools 274, the circuit design system may use tools such as placement and routing tools 276 to perform physical design steps (layout synthesis operations). Placement and routing tools 276 are used to determine where to place each gate of the gate-level netlist produced by tools 274. For example, if two counters interact with each other, the placement and routing tools 276 may locate these counters in adjacent regions to reduce interconnect delays or to satisfy timing requirements specifying the maximum permitted interconnect delay. The placement and routing tools 276 create orderly and efficient implementations of circuit designs for any targeted integrated circuit (e.g., for a given programmable integrated circuit such as a field-programmable gate array (FPGA).)

Tools such as tools 274 and 276 may be part of a compiler suite (e.g., part of a suite of compiler tools provided by a programmable logic device vendor). In accordance with an embodiment, tools such as tools 274, 276, and 278 automatically take into account the effects of crosstalk between interconnects while implementing a desired circuit design. Tools 274, 276, and 278 may also include timing analysis tools such as timing estimators. This allows tools 274 and 276 to satisfy performance requirements (e.g., timing requirements) before actually producing the integrated circuit.

After an implementation of the desired circuit design has been generated using placement and routing tools 276 the implementation of the design may be analyzed and tested using analysis tools 278. After satisfactory optimization operations have been completed using tools 260, tools 260 may produce a mask-level layout description of the integrated circuit and/or configuration data for programming the configuration memory elements on the integrated circuit.

In some embodiments, more than one circuit design may be implemented on the integrated circuit. For example, multiple instances of the same or substantially the same circuit design may be implemented at different locations on the integrated circuit. In other embodiments, variations of a base circuit design may be implemented on the integrated circuit. The example in which different variations of a base circuit design are implemented through the programming of configuration memory bits at a same location on the integrated circuit is also sometimes referred to as reconfiguration or as partial reconfiguration in the event that the reconfiguration is limited to a subset of the configuration memory bits on the integrated circuit.

Figure 3:
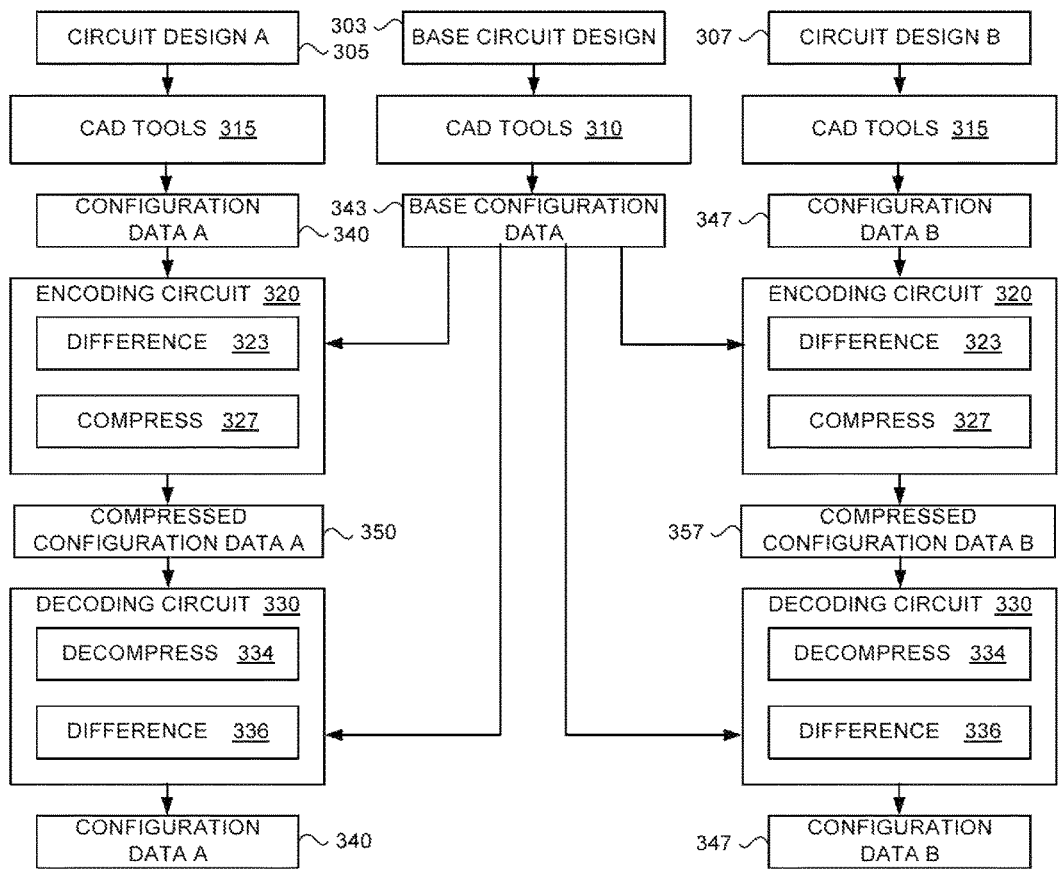
FIG. 3 is a diagram of illustrative circuitry for encoding and decoding configuration data that implements a circuit design in an integrated circuit in accordance with an embodiment.

As an example, consider FIG. 3 with circuit design A (305) and circuit design B (307) as two variations of base circuit design 303. In this example, CAD tools 310 (e.g., CAD tools 260 of FIG. 2) may generate base configuration data 343 for base circuit design 303, and CAD tools 315 may generate configuration data A (340) for circuit design A (305) and configuration data B (347) for circuit design B (307), respectively.

In some embodiments, CAD tools 315 may perform the same operations as CAD tools 310 to generate configuration data A (340) and configuration data B (347), respectively. In other embodiments, CAD tools 315 may perform incremental operations (e.g., incremental synthesis, incremental placement, incremental routing, etc.) on new or changed components of circuit design A (305) and circuit design B (307) compared to base circuit design 303. Incremental compilation may preserve portions of base configuration data 343 related to old or unchanged components of circuit design A (305) and circuit design B (307) compared to base configuration data 343 and generate new configuration data for new or changed components of circuit design A (305) and circuit design B (307) compared to base circuit design 303.

Incremental operations are described in commonly assigned U.S. Pat. Nos. 8,296,695, 8,484,596, 8,281,274, and 8,539,418 and U.S. patent application Ser. No. 14/200, 897, which are incorporated by reference herein in their entireties.

Encoding circuit 320 may receive configuration data A (340) and base configuration data 343. Encoding circuit 320 may include circuitry 323 that determines the difference between configuration data A (340) and base configuration data 343 and circuitry 327 that compresses the determined difference between configuration data A (340) and base configuration data 343 to produce compressed configuration data A (350).

Figure 4:
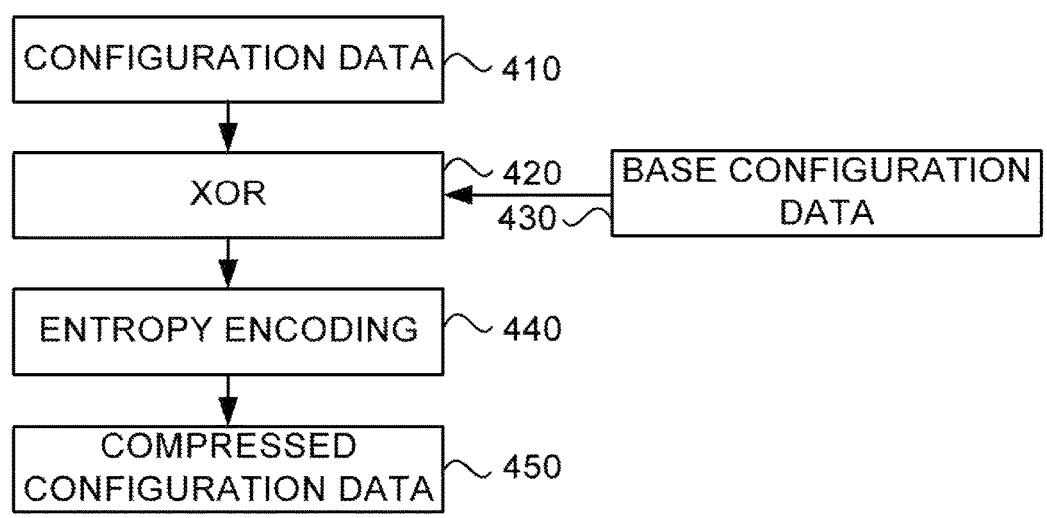
FIG. 4 is a flowchart of illustrative steps for generating compressed configuration data using configuration data and a base configuration in accordance with an embodiment.

An embodiment of encoding circuit 320 is shown in FIG. 4. As shown in FIG. 4, circuitry 323 may be implemented by a bit-wise logic exclusive OR (XOR) operation 420 between configuration data 410 and base configuration data 430 to determine the bits that are different. In this example, bits that are different are logic '1' and bits that are the same are logic '0'.

If desired, circuitry 323 of FIG. 3 may perform other operations to determine the difference between configuration data A (340) and base configuration data 343. For example, circuitry 323 may perform a subtraction, an addition, a bit-wise logic exclusive NOR (XNOR) operation, etc. of configuration data A (340) and base configuration data 343 to determine their difference.

As shown in FIG. 3, encoding circuit 320 may include circuitry 327 that compresses the result of the difference operation to produce compressed configuration data A (350). Circuitry 327 may implement any lossless data compression technique. Lossless data compression techniques may take advantage of statistical redundancy in data to represent the information that is conveyed by the data with fewer bits, while preserving all the information and thereby ensuring that the compression operation is completely reversible. For example, circuitry 327 may implement grammar-based codes such as the Sequitur algorithm, Lempel-Ziv compression methods such as the DEFLATE algorithm, or entropy encoding such as Huffman coding or arithmetic coding, just to name a few.

As shown in FIG. 4, circuitry 327 may perform an entropy encoding operation 440. Entropy encoding operation 440 may compress the result of the bit-wise logic exclusive OR (XOR) operation 420 of configuration data 410 and base configuration data 430 and produce compressed configuration data 450.

As an example, consider that entropy encoding operation 440 implements Huffman encoding. As with other entropy encodings, Huffman encoding may use fewer bits to represent more common symbols than less common symbols. In the example of using a bit-wise logic exclusive OR operation 420 of configuration data 410 and base configuration data 430, logic '0' may be more common than logic '1' if configuration data 410 and base configuration data 430 are similar.

Similarly, encoding circuit 320 of FIG. 3 may receive configuration data B (347) and base configuration data 343. Encoding circuit 320 may determine the difference between configuration data B (347) and base configuration data 343 using difference circuitry 323. Encoding circuit 320 may further use compression circuitry 327 to compress the result of the difference operation to produce compressed configuration data B (357).

If desired, encoding circuit 320 may be implemented as a CAD tool such as CAD tool 210 of FIG. 2A and executed on computing equipment to generate compressed configuration data A (350) and B (357) using base configuration data 343 and configuration data A (340) or configuration data B (347), respectively. In some embodiments, encoding circuit 320 may be a dedicated circuit that is located on the integrated circuit or outside the integrated circuit and that performs the encoding of configuration data. In other embodiments, encoding circuit 320 may be a configurable circuit that is programmed to encode configuration data.

There may be one encoding circuit 320 that handles the encoding of different configuration data at different times. If desired, there may be multiple instance of encoding circuit 320, where each instance handles a separate set of configuration data. Alternatively, there may be some instances of encoding circuit 320 that handle the encoding of different configuration data at different times, while other instances of encoding circuit 320 handle a separate set of configuration data.

One or more storage circuits may store base configuration data 343 and compressed configuration data A (350) and B (357), respectively. The integrated circuit that implements circuit design A (305) may include the one or more storage circuits (e.g. in the same die or in the same package). If desired, the one or more storage circuits may be external to the integrated circuit. In some embodiments, the integrated circuit may include at least one storage circuit to store at least a portion of the compressed configuration data, while the remaining storage circuits that store the remainder of the compressed configuration data are located outside the integrated circuit.

For implementing circuit design A in an integrated circuit such as programmable logic device 100 of FIG. 1, decoding circuit 330 of FIG. 3 may access the one or more storage circuits that store compressed configuration data A (350) and base configuration data 343. Decoding circuit 330 may include circuitry 334 that decompresses the compressed configuration data A (350) and circuitry 336 that determines the difference between the decompressed version of compressed configuration data A (350) and base configuration data 343 to restore configuration data A (340).

Figure 5:
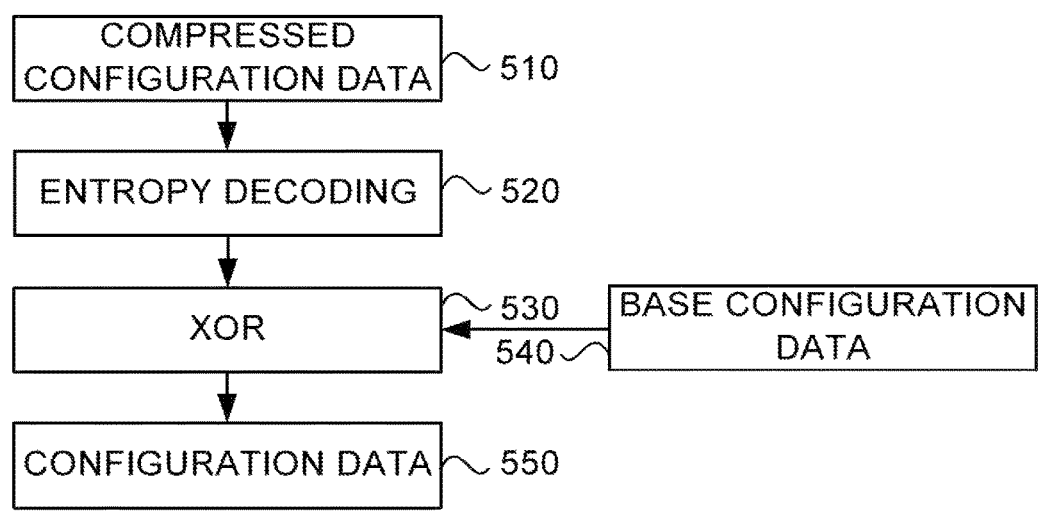
FIG. 5 is a flowchart of illustrative steps for generating configuration data using compressed configuration data and a base configuration in accordance with an embodiment.

Circuitry 334 may implement any lossless data decompression technique as long as the selected decompression technique reverses the data compression performed in circuitry 327. As an example, consider the operations shown in FIG. 5. As shown in FIG. 5, circuitry 334 may perform entropy decoding operation 520. Entropy decoding operation 520 may decompress compressed configuration data 510. As an example, consider that entropy encoding operation 440 of FIG. 4 implements Huffman encoding. As a result, entropy decoding 520 of FIG. 5 may implement Huffman decoding.

Circuitry 336 of FIG. 3 may determine the difference between the decompressed configuration data generated by circuitry 334 and base configuration data 343. Circuitry 336 may implement any difference operation as long as the selected difference operation inverses the difference operation performed in circuitry 323. For example, difference operation 336 may perform a subtraction if difference operation 323 is an addition, an addition if difference operation 323 is a subtraction, a bit-wise logic exclusive NOR (XNOR) operation if difference operation 323 is a bit-wise logic exclusive NOR (XNOR) operation, etc.

As shown in FIG. 5, circuitry 336 may implement a bit-wise logic exclusive OR (XOR) operation 530 between the decompressed configuration data generated by entropy decoding 520 and base configuration data 540 to reverse the bit-wise logic exclusive OR (XOR) operation 420 of FIG. 4 and to restore configuration data 550, which is identical to configuration data 410 of FIG. 4.

Similarly, decoding circuit 330 of FIG. 3 may receive compressed configuration data B (357) and base configuration data 343. Decoding circuit 330 may use circuitry 334 to decompress the compressed configuration data B (357). Decoding circuit 320 may determine the difference between the result of the decompression operation 334 and base configuration data 343 using circuitry 336 to restore configuration data B (347).

Consider the scenario in which circuit design A and circuit design B implement the same functionality and that configuration data A (340) differs from configuration data B (347) in that configuration data A (340) targets a different location on the integrated circuit than configuration data B (347). In this scenario, decoding circuit 330 may retrieve compressed configuration data A (350) and compressed configuration data B (357) from the storage circuit and restore configuration data A (340) and configuration data B (347). The restored configuration data A (340) and B (347) may then serve to program configuration memory bits on the integrated circuit, thereby implementing circuit designs A (305) and B (307), respectively.

In another scenario, circuit designs A (305) and B (307) may represent variations of a base circuit design implemented in the framework of partial reconfiguration on the integrated circuit. In other words, circuit designs A (305) and B (307) may implement different functionalities, but target the same location on the integrated circuit. In this scenario, decoding circuit 330 may retrieve compressed configuration data A (350) from the storage circuit and restore configuration data A (340). The restored configuration data A (340) may then serve to program configuration memory bits at a given location on the integrated circuit, thereby implementing circuit designs A (305). Circuit design A may operate during a first duration of time.

After the first duration of time, decoding circuit 330 may retrieve compressed configuration data B (357) from the storage circuit and restore configuration data B (347). The restored configuration data B (347) may then serve to reprogram the configuration memory bits at the given location on the integrated circuit, thereby implementing circuit designs B (307). Circuit design B may operate during a second duration of time.

If desired, decoding circuit 330 may be implemented as a CAD tool such as CAD tool 210 of FIG. 2A and executed on computing equipment to restore configuration data A (340) and B (347) using base configuration data 343 and compressed configuration data A (350) or compressed configuration data B (357), respectively. In some embodiments, decoding circuit 330 may be a dedicated circuit that performs the decoding of compressed configuration data. In other embodiments, decoding circuit 330 may be a configurable circuit that is programmed to decode configuration data.

There may be one decoding circuit 330 that handles the decoding of different compressed configuration data at different times. If desired, there may be multiple instance of decoding circuit 330 where each instance handles a separate set of compressed configuration data. Alternatively, there may be some instances of decoding circuit 330 that handle the decoding of different compressed configuration data at different times, while other instances of decoding circuit 330 handle a separate set of compressed configuration data.

Figure 6:
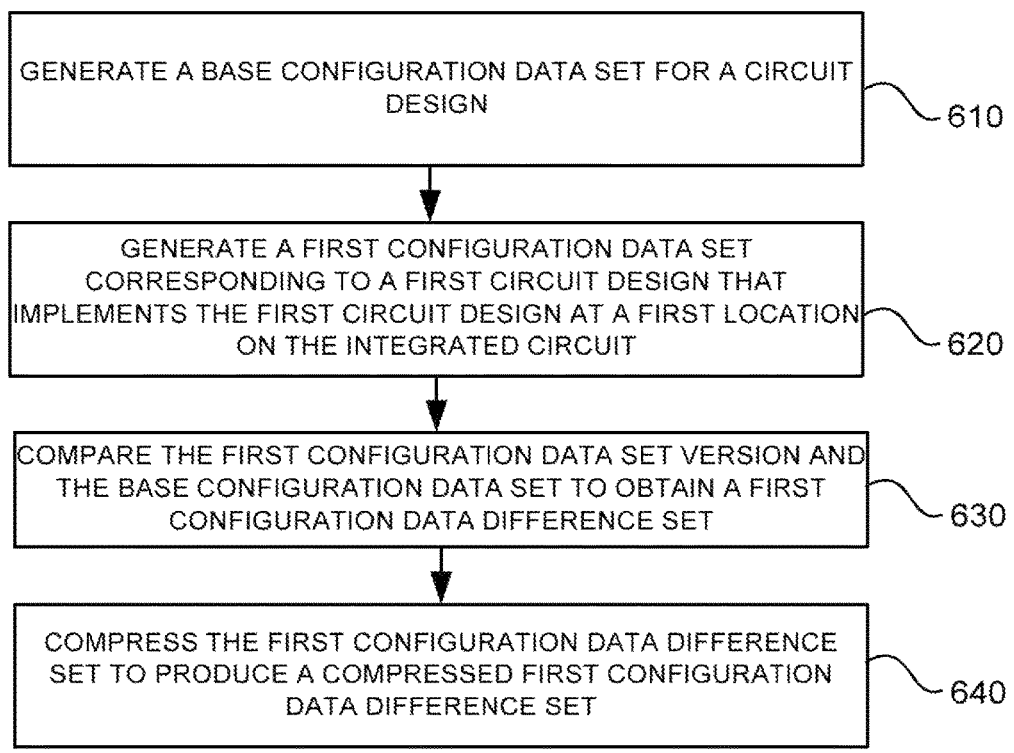
FIG. 6 is a flow chart of illustrative steps for generating a compressed configuration data set based on a comparison of a variation with a base configuration data set in accordance with an embodiment.

FIG. 6 is a flow chart of illustrative steps for generating a compressed configuration data set based on a comparison of a variation with a base configuration data set in accordance with an embodiment. During step 610, a CAD tool may generate a base configuration data set for a circuit design. For example, CAD tool 310 of FIG. 3 may generate base configuration data 343 of base circuit design 303.

During step 620, the CAD tool may generate a first configuration data set corresponding to a first circuit design that implements the first circuit design at a first location on the integrated circuit. For example, CAD tool 315 of FIG. 3 may generate configuration data A (340) of circuit design A (305).

During step 630, the CAD tool may compare the first configuration data set and the base configuration data set to obtain a first configuration data difference set. For example, circuitry 323 of FIG. 3 may determine the difference between configuration data A (340) and base configuration data 343.

During step 640, the CAD tool may compress the first configuration data difference set to produce a compressed first configuration data difference set. For example, circuitry 327 of FIG. 3 may compress the output of circuitry 323 to produce compressed configuration data A (350).

Figure 7:
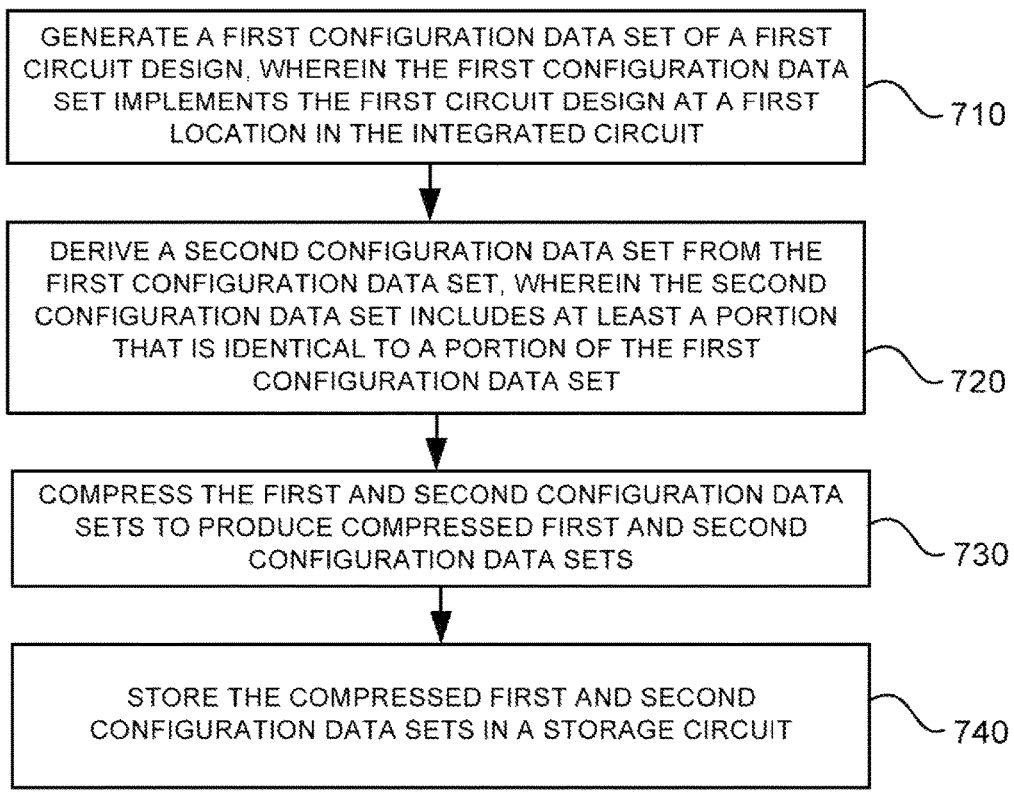
FIG. 7 is a flow chart of illustrative steps for generating two compressed configuration data sets and storing those compressed data sets in a storage circuit in accordance with an embodiment of the invention.

FIG. 7 is a flow chart of illustrative steps for generating two compressed configuration data sets and storing those compressed data sets in a storage circuit in accordance with an embodiment of the invention. During step 710, a CAD tool may generate a first configuration data set of a first circuit design. The first configuration data set may implement the first circuit design at a first location on the integrated circuit.

During step 720, the CAD tool may derive a second configuration data set from the first configuration data set. The second configuration data set may include at least a portion that is identical to a portion of the first configuration data set. For example, the second configuration data set may implement the same functionality as the first configuration data set at a different location on the integrated circuit. In this example, the portions of the configuration data in the two configuration data sets that determine the functionality of the circuit design may be identical, while the portions of the configuration data in the two configuration data sets that determine the location of the circuit design implementations on the integrated circuit may be different.

During step 730, the CAD tool may compress the first and second configuration data sets to produce compressed first and second configuration data sets. For example, the CAD tool may use entropy encoding such as Huffman encoding, arithmetic encoding, universal encoding, or Golomb encoding. During step 740, the CAD tool may store the compressed first and second configuration data sets in a storage circuit.

The method and apparatus described herein may be incorporated into any suitable integrated circuit or system of integrated circuits. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable integrated circuits (EPLDs), electrically erasable programmable integrated circuits (EEPLDs), logic cell arrays (LCAs), field programmable gate arrays (FPGAs), application specific standard products (ASSPs), application specific integrated circuits (ASICs), just to name a few.

The programmable integrated circuit described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable integrated circuit can be used to perform a variety of different logic functions. For example, the programmable integrated circuit can be configured as a processor or controller that works in cooperation with a system processor. The programmable integrated circuit may also be used as an arbiter for arbitrating access to a shared resource in the data processing system. In yet another example, the programmable integrated circuit can be configured as an interface between a processor and one of the other components in the system. In one embodiment, the programmable integrated circuit may be one of the families of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. Configuration circuitry comprising:
 a decoding circuit that receives a base configuration data set and a first data set, wherein the first data set includes compressed data differences between the base configuration data set and a decoded configuration data set, and wherein the decoding circuit comprises:
  a first circuit that receives the first data set and that decompresses the first data set to create a second data set; and
  a second circuit that receives the base configuration data set and the second data set from the first circuit and that outputs the decoded configuration data set using the base configuration data set and the second data set.

2. The configuration circuitry of claim 1, wherein the configuration circuitry programs a configurable circuit using the decoded configuration data set to implement a first circuit design on the configurable circuit.

3. The configuration circuitry of claim 2, wherein the first circuit receives a third data set that includes other compressed data differences between the base configuration data set and an additional decoded configuration data set, and wherein the first circuit decompresses the received third data set to create a fourth data set.

4. The configuration circuitry of claim 3, wherein the second circuit receives the base configuration data set and the fourth data set from the first circuit, wherein the second circuit restores the additional decoded configuration data set using the base configuration data set and the fourth data set.

5. The configuration circuitry of claim 4, wherein the configuration circuitry programs an additional configurable circuit with the additional decoded configuration data set to implement the first circuit design on the additional configurable circuit.

6. The configuration circuitry of claim 4, wherein the configuration circuitry programs the configurable circuit with the additional decoded configuration data set to implement a second circuit design on the configurable circuit.

7. The configurable circuitry of claim 1, wherein the first circuit further comprises:
 an entropy decoding circuit that performs entropy decoding.

8. The configurable circuitry of claim 7, wherein the entropy decoding comprises a method selected from the group consisting of: Huffman decoding, arithmetic decoding, universal decoding, and Golomb decoding.

9. The configurable circuitry of claim 1, wherein the second circuit further comprises:
 a logic exclusive OR gate that performs a logic exclusive OR operation between a bit of the base configuration data set and a bit of the second data set.

10. A method for handling configuration data sets, the method comprising:
 with a computer-aided design (CAD) tool, generating a base configuration data set for a base circuit design in an integrated circuit;

with the CAD tool, generating a first configuration data set corresponding to a first circuit design in the integrated circuit, wherein the first configuration data set implements the first circuit design at a first location on the integrated circuit;

comparing the first configuration data set with the base configuration data set to obtain a first configuration data difference set; and compressing the first configuration data difference set to produce a compressed first configuration data difference set.

11. The method of claim 10, further comprising:

with the CAD tool, generating a second configuration data set using the first circuit design, wherein the second configuration data set implements the first circuit design at a second location on the integrated circuit;

comparing the second configuration data set and the base configuration data set to determine a second configuration data difference set; and compressing the second configuration data difference set to produce a compressed second configuration data difference set.

12. The method of claim 10, wherein compressing the first configuration data difference set comprises:

performing entropy encoding of the first configuration data difference set.

13. The method of claim 12, wherein the entropy encoding is selected from the group consisting of: Huffman encoding, arithmetic encoding, universal encoding, and Golomb encoding.

14. The method of claim 10, further comprising:

restoring the first configuration data set based on the compressed first configuration data difference set and the base configuration data set; and programming circuitry at the first location on the integrated circuit with the restored first configuration data set to implement the first circuit design.

15. The method of claim 14, wherein restoring the first configuration data set comprises:

producing the first configuration data difference set by decompressing the compressed first configuration data difference set; and comparing the first configuration data difference set and the base configuration data set to determine the first configuration data set.

16. The method of claim 14, further comprising:

with the CAD tool, generating a second configuration data set of a second circuit design that is different than the first circuit design;

comparing the second configuration data set and the base configuration data set to determine a second configuration data difference set; and producing a compressed second configuration data difference set based on the second configuration data difference set.

17. The method of claim 16, further comprising:

restoring the second configuration data set based on the compressed second configuration data difference set and the base configuration data set; and programming circuitry at the first location on the integrated circuit with the restored second configuration data set to implement the second circuit design.

18. The method of claim 10, wherein generating a first configuration data set corresponding to a first circuit design further comprises:

performing an incremental compilation of the first circuit design to generate the first configuration data set, wherein the first circuit design and the base circuit design are at least partially identical, and wherein the incremental compilation produces the first configuration data set based on at least a portion of the base configuration data set.

19. A method for generating configuration data for a configurable circuit, the method comprising:

with a computer-aided design tool, generating a first configuration data set for a first circuit design in an integrated circuit, wherein the first configuration data set implements the first circuit design at a first location on the integrated circuit;

deriving a second configuration data set from the first configuration data set, wherein the second configuration data set includes at least a portion that is identical to the first configuration data set; and compressing the first configuration data set to produce a compressed first configuration data set and compressing the second configuration data set to produce a compressed second configuration data set.

20. The method of claim 19, wherein deriving the second configuration data set further comprises:

generating a third configuration data set for a second circuit design, wherein the third configuration data set implements the second circuit design at the first location on the integrated circuit.

21. The method of claim 20, further comprising:

comparing the third configuration data set with the first configuration data set to produce the second configuration data set, wherein the second configuration data set reflects differences between the first configuration data set and third configuration data set.

22. The method of claim 19, wherein deriving the second configuration data set further comprises:

generating a location offset between the first location on the integrated circuit and a second location on the integrated circuit.

23. The method of claim 22, further comprising:

combining the location offset with the first configuration data set to produce the second configuration data set, wherein the second configuration data set implements the first circuit design at the second location on the integrated circuit.

24. The method of claim 19, further comprising:

storing the compressed first configuration data set and the compressed second configuration data set in a storage circuit.

25. The method of claim 19, wherein compressing the first configuration data set and the second configuration data set further comprises:

using lossless encoding to produce the compressed first configuration data set.

* * * * *